United States Patent [19]

Miller et al.

[11] Patent Number: 4,845,842

[45] Date of Patent: Jul. 11, 1989

[54] PROCESS FOR REDUCING LEAD SWEEP IN INTEGRATED CIRCUIT PACKAGES

[75] Inventors: Herbert Miller; Richard D. Harline, both of San Jose, Calif.

[73] Assignee: National Semiconductor Corporation, Santa Clara, Calif.

[21] Appl. No.: 125,428

[22] Filed: Nov. 25, 1987

[51] Int. Cl.$^4$ ............................................. H01R 43/00
[52] U.S. Cl. .......................................... 29/827; 357/70; 357/80; 361/400
[58] Field of Search ................. 29/827, 837, 845, 847; 357/80, 70; 361/400

[56] References Cited

U.S. PATENT DOCUMENTS

| | | | |
|---|---|---|---|
| 3,544,857 | 12/1970 | Byrne et al. | 29/827 |
| 4,234,666 | 11/1980 | Gursky | 357/70 X |
| 4,704,187 | 11/1987 | Fujita | 29/827 X |

FOREIGN PATENT DOCUMENTS

| | | | |
|---|---|---|---|
| 58-17648 | 2/1983 | Japan | 29/827 |
| 58-139454 | 8/1983 | Japan | 357/70 |
| 59-16356 | 1/1984 | Japan | 29/827 |
| 60-164345 | 8/1985 | Japan | 29/827 |
| 61-23352 | 1/1986 | Japan | 29/827 |

OTHER PUBLICATIONS

IBM Tech Discl Bull, vol. 28, No. 12, May 1986, pp. 5174–5175.
IBM Tech Discl Bull, vol. 30, No. 5, Oct. 1987, p. 288.

Primary Examiner—Carl J. Arbes
Attorney, Agent, or Firm—Flehr, Hohbach, Test, Albritton & Herbert

[57] ABSTRACT

A metal sheet (58) to be etched into lead frames has an emulsion coating (60) on its top and bottom. A bottom glass plate (56) has a mask pattern (64) defining the pattern of metal from the sheet (58) that is to remain after etching to form the lead frame. The pattern (64) has a first line width d1. A top glass plate (62) has a corresponding mask pattern (66) also defining the pattern of metal from the sheet (58) that is to remain after etching to form the lead frame. The mask pattern (66) has a second line width d2 that is less than the first line width. The emulsion coating (60) on the sheet (58) is exposed through the mask plates (56) and (62), and the emulsion coating is developed in a conventional manner to give photoresist patterns (64a) and (b 66a) or (64b) and (66b) on the metal sheet (58). The patterns (64a) and (66a) are produced when the mask plates (56) and (62) are in exact registration with each other, and the patterns (64b) and (66b) are produced when the mask plates (56) and (62) are misaligned to the greatest extent permissible while avoiding lead sweep. The metal sheet (58) with the photoresist patterns (64a) and (66a) or (64b) and (66b) in place is then etched in a convention etching process to produce a lead frame and the photoresist patterns are stripped from the resulting etched lead frame. When the leads from the lead frame formed in this way are bent in the fabrication of an integrated circuit package substantially less lead sweep results.

3 Claims, 4 Drawing Sheets

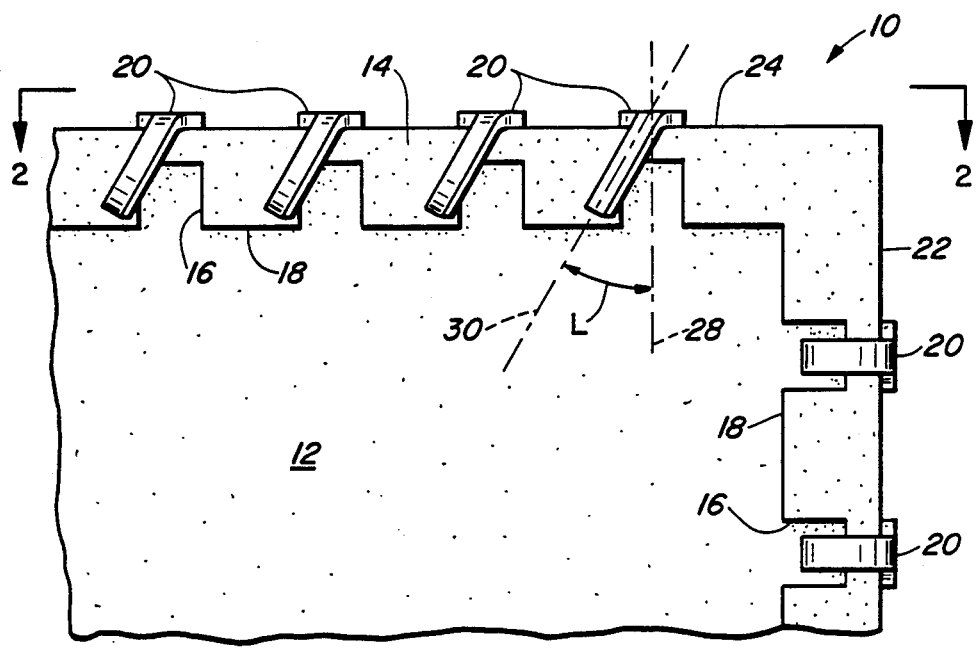
FIG._1.
(PRIOR ART)
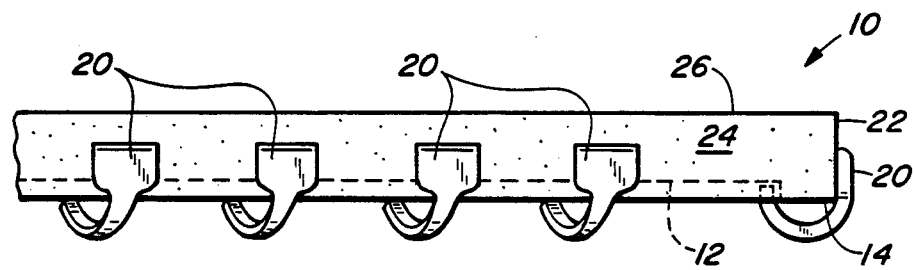
FIG._2.
(PRIOR ART)

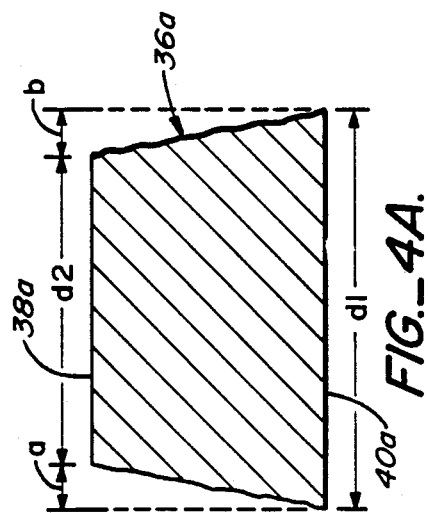
FIG._4A.
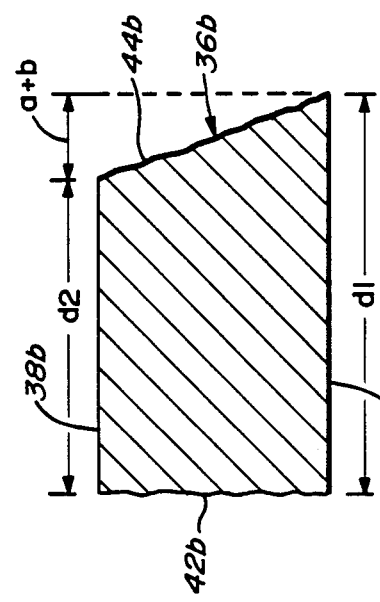
FIG._4B.
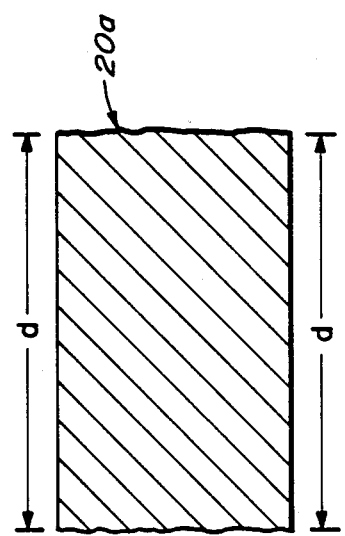
FIG._3A.
(PRIOR ART)
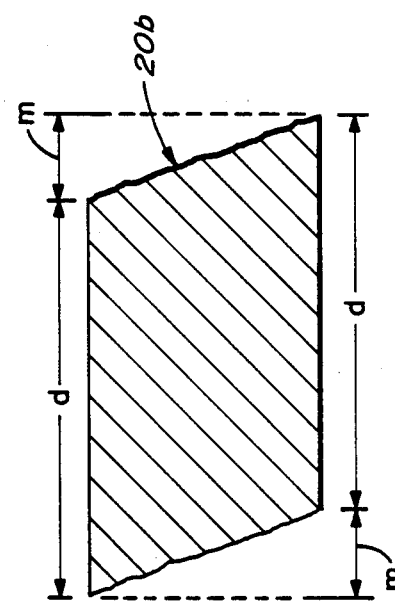
FIG._3B.
(PRIOR ART)

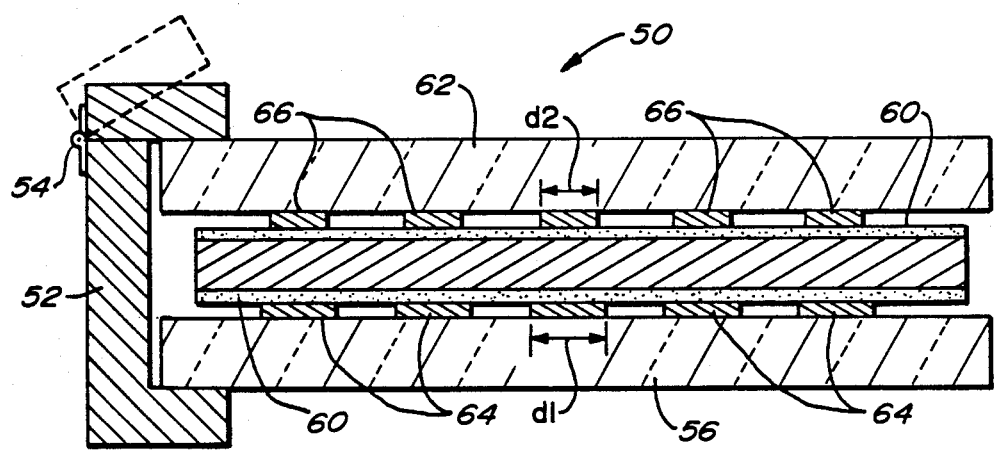
FIG._5.
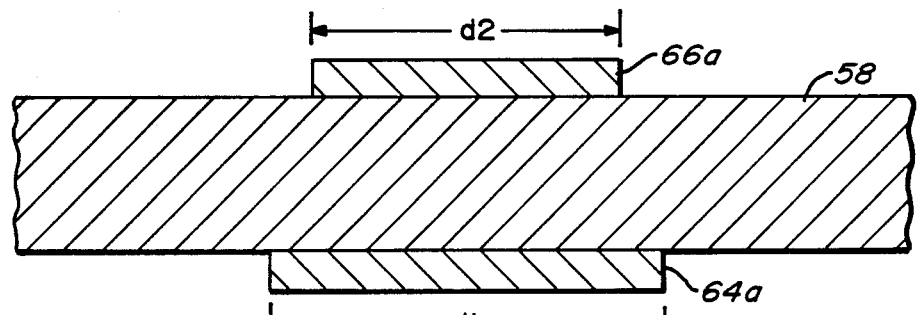
FIG._6A.
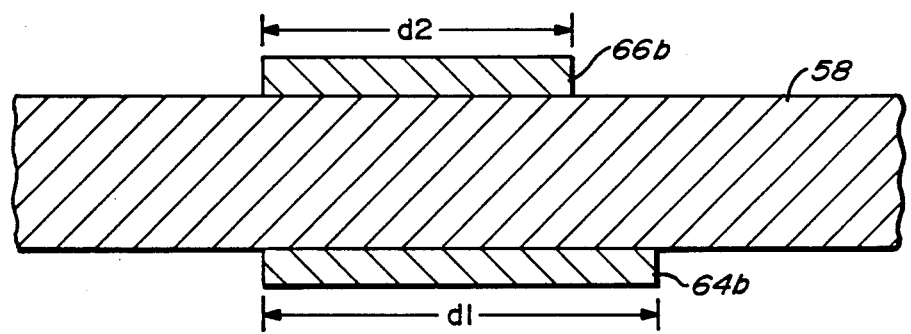
FIG._6B.

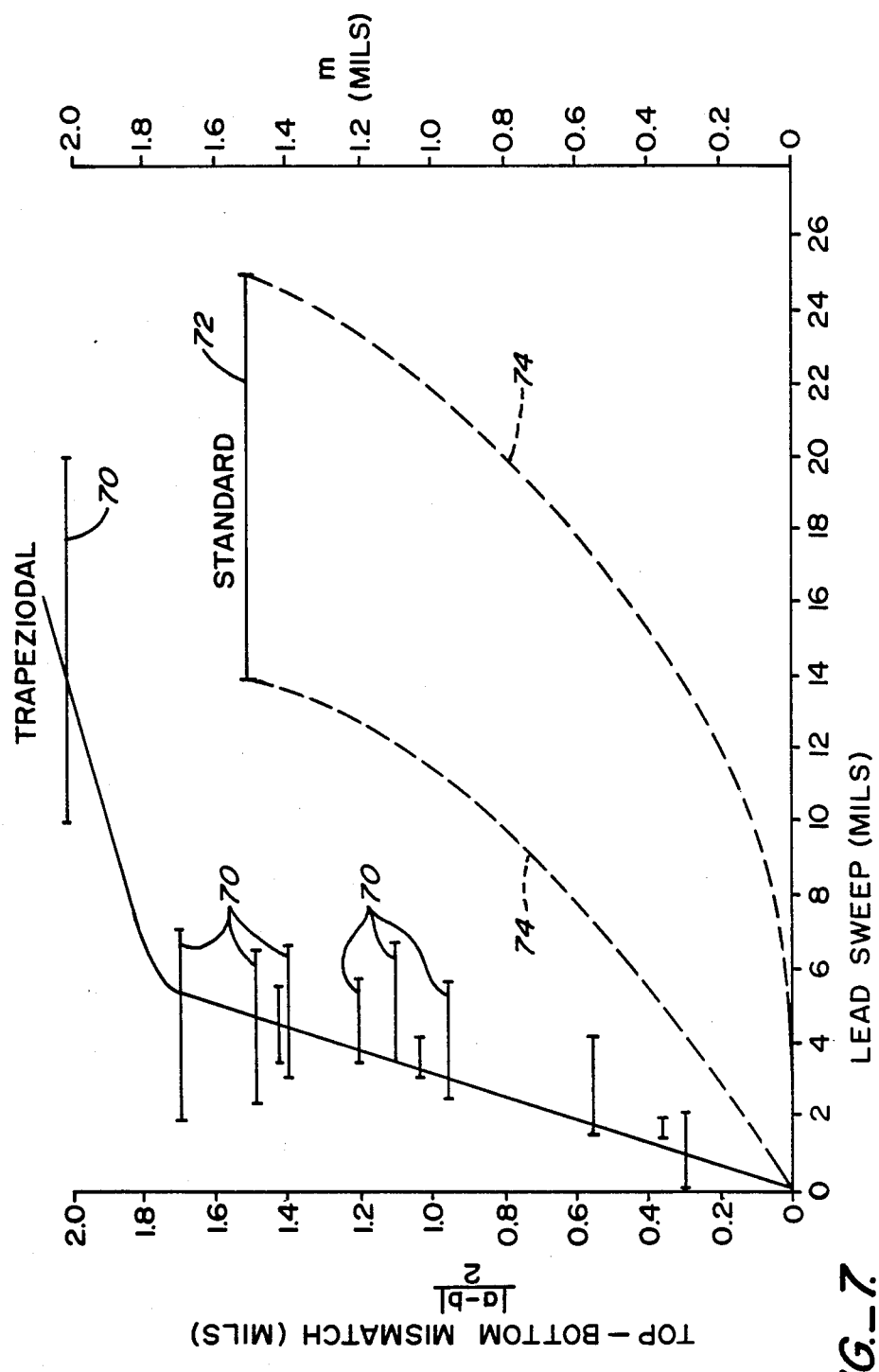
FIG._7.

PROCESS FOR REDUCING LEAD SWEEP IN INTEGRATED CIRCUIT PACKAGES

BACKGROUND OF THE INVENTION

1. Field of the Invention

This invention relates to a process for preventing lateral displacement of formed leads on integrated circuit packages. Such lateral displacement is hereinafter referred to as lead sweep. More particularly, it relates to such a process for preventing lead sweep in such packages which utilize etched lead frames. Most especially, it relates to such a process for preventing lead sweep in such packages which utilize "J" bends in the formed leads.

2. Description of the Prior Art

In the fabrication of integrated circuit packages, leads which are connected at their tips to the integrated circuit inside the package and extend outside the package for connection to the next level of packaging, such as a printed circuit board, are provided in lead frames during fabrication. The frame is cut away to leave the desired leads after assembly of the package. While the lead frames can be fabricated by a metal stamping operation, the technique of choice for low volume production, start up or development projects in the integrated circuit industry is to fabricate the lead frames by a double sided etching process. Such a process allows close control over dimensions of the resulting leads, especially at their narrow and closely spaced tips, where they attach to the integrated circuit. However, a problem encountered with such double sided etched lead frames is that the resulting leads tend to deform laterally when they are bent, such as to form the J bend conventionally employed with chip carrier packages. This lateral deformation or lead sweep causes misregistration of the leads on the integrated circuit packages when they are positioned for attachment to the next level of packaging. While this problem can be prevented by using stamped lead frames, such stamped lead frames are not suitable for many integrated circuit packages, due to excessive tooling cost or other considerations.

SUMMARY OF THE INVENTION

Accordingly, it is a primary object of this invention to provide a process for substantially reducing lead sweep in integrated circuit packages incorporating double sided etched leads.

It is another object of the invention to provide such a process for use with integrated circuit packages utilizing J bends in the leads of the packages.

It is a further object of the invention to provide such a process which provides a substantially increased tolerance for misalignment in the two masks used for the double sided etched leads.

The attainment of these and related objects may be achieved through use of the novel process for substantially reducing lead sweep herein disclosed. In a process in accordance with this invention, a metal sheet from which leads of the package are to be formed is provided. An upper and a lower surface of the metal sheet is coated with photoresist layers. First and second masks are provided having corresponding patterns defining the leads to be formed in the metal sheet but with different line widths for the upper and lower surfaces of the metal sheet. The photoresist layer on the upper surface of the metal sheet is exposed through the first mask. The photoresist layer on the lower surface of the metal sheet is exposed through the second mask. The photoresist layers are developed. The metal sheet is etched to form the leads of the package. The package is assembled on the leads and the leads are bent to complete the package.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 1 is a plan view of a portion of an integrated circuit package fabricated with a prior art process, useful for understanding the problem addressed by the invention.

FIG. 2 is a side view of the integrated circuit package of FIG. 1.

FIGS. 3A and 3B are cross-sections of leads etched with a prior art process, useful for a further understanding of the lead sweep problem.

FIGS. 4A and 4B are corresponding cross-sections of leads etched with the process of the invention.

FIG. 5 is a cross-section view of tooling used to practice the process of the invention.

FIGS. 6A and 6B are cross-section views of metal members during practice of the process of the invention.

FIG. 7 is a graph showing results obtained with the process of the invention.

DETAILED DESCRIPTION OF THE INVENTION

Turning now to the drawings, more particularly to FIGS. 1 and 2, there is shown a portion of an integrated circuit package 10, useful to understand the nature of the lead sweep problem. The package 10 has a generally planar bottom 12 with a ridge 14 extending around the periphery of the bottom 12. The ridge 14 has castellations 16 spaced around its sides 18 facing inward on the bottom 12. Leads 20 extend at sides 22 and 24 from within the package 10 and are sandwiched between the bottom 12 and a top 26, which is coextensive with the bottom 12. The leads 20 are bent up along the sides 22 and 24 and over the ridge 14 in a J configuration In the case of the leads 20 at side 22, the leads extend into the castellations 16 as intended. However, the leads 20 at side 24 pass to one side of the castellations 16. This misregistration of the leads 20 at side 24 represents lead sweep. Lead sweep is best defined as the difference L of the centerline 28 of the lead at the exit from the package to the centerline 30 of the formed portion of the lead, as shown in FIG. 1. As shown in FIG. 1, lead sweep often does not occur with all of the leads 20 on the package 10. Excessive lead sweep is prevalent on the formed leads of packages that are made from lead frames that are etched, either with chemical milling or photochemical milling.

Analysis of packages exhibiting lead sweep has showed that the cross-section of the leads 20 has an effect on the lead sweep. The etched lead frames are formed by masking a metal sheet, such as a nickel iron alloy or a copper alloy with, for example, iron and cobalt or zirconium, on its top and bottom with a photoresist in a pattern corresponding to the leads to be formed, then contacting the masked metal sheet with a suitable etchant, such as ferric chloride or cupric chloride. FIGS. 3A and 3B show the effect of alignment of the top and bottom mask patterns in the etching process as conventionally practiced. When the top and bottom masks are in alignment, the lead 20a is etched a rectangular cross section, and the lead 20a will form in the manner of the leads 20 extending from the side 22 in FIGS. 1 and 2 when it is bent in the J configuration. On the other hand, if the top and bottom masks are out of alignment, the lead 20b is etched in a generally parallelogram configuration. When the lead 20b is bent in the J configuration, its parallelogram configuration causes it to deform so that its centerline at its tip is not coincident with its centerline at the exit from between the top and bottom of a package incorporating it, as shown with the leads 20 extending from the side 24 of the package 10.

In accordance with this invention, a top mask having a different width for the lead patterns than the width of the lead patterns in the bottom mask allows the lead sweep problem to be significantly reduced to an acceptable level. FIGS. 4A and 4B show leads 36a and 36b that have been fabricated with such top and bottom masks having different widths. When the top and bottom masks are in alignment, top 38a of the lead 36a has a lesser width than bottom 40a and the top 38a is centered with respect to the bottom 40a to give a generally trapezoidal shape. When the top and bottom masks are grossly out of alignment, as shown in FIG. 4B, lead 36b has its top 38b positioned to one side with respect to bottom 40b, so that side 42b forms a 90° angle with respect to the top 38b and bottom 40b, while side 44b is at an inclined angle with respect to the top 38a and bottom 40b. Lead sweep will occur to some extent as shown in FIG. 7. However, when the angle of side 42b with respect to bottom 40b is less than 90°, then lead sweep is acceptable, as shown in FIG. 7. The maximum misalignment between the top and bottom masks that will not produce unacceptable lead sweep is when the relationship discussed below is satisfied. The different pattern widths on the top and bottom masks thus produce an alignment tolerance that permits a substantial amount of misalignment without producing lead sweep.

In FIG. 4A, the distances a and b are a measure of the difference in size of the top and bottom masks, and the relationship between a and b is also a measure of the amount of misalignment between the top and bottom masks. In practice, for a metal sheet having a thickness of between about 5 to about 10 mils (thousandths of an inch) to be etched into leads and in which a=b=2 mils for perfectly aligned top and bottom masks, if a and b satisfy the following relationship, lead sweep will be controlled to an acceptable level:

$$\frac{|a - b|}{2} \leq 1.5$$

Thus, either a or b can approach 1 mil for 5 mil thick metal sheet and either a or b can approach 3 to 3.5 mils for 10 mil thick metal sheet.

FIG. 5 shows tooling 50 that is conveniently usable to practice the process of the invention. A clamp 52 hinged at 54 holds a bottom glass plate 56, a metal sheet 58 to be etched into lead frames and having an emulsion coating 60 on its top and bottom, and a top glass plate 62. The bottom glass plate has a mask pattern 64 defining the pattern of metal from the sheet 58 that is to remain after etching to form the lead frame. The pattern 64 has a first line width d1. The top glass plate has a corresponding mask pattern 66 also defining the pattern of metal from the sheet 58 that is to remain after etching to form the lead frame. The mask pattern 66 has a second line width d2 that is less than the first line width. In use of the tooling 50, the clamp 52 is opened to allow easy insertion and removal of the mask plates 56 and 62 and the metal sheet 58 to be etched.

The emulsion coating 60 on the sheet 58 is exposed through the mask plates 56 and 62, the sheet 58 is removed from the clamp 52, and the emulsion coating is developed in a conventional manner to give photoresist patterns 64a and 66a or 64b and 66b on the metal sheet 58, as shown in FIGS. 6A and 6B. The patterns 64a and 66a are produced when the mask plates 56 and 62 are in exact registration with each other, and the patterns 64b and 66b are produced when the mask plates 56 and 62 are misaligned to the greatest extent permissible while avoiding lead sweep. The metal sheet 58 with the photoresist patterns 64a and 66a or 64b and 66b in place is then etched in a conventional etching process to produce a lead frame and the photoresist patterns are stripped from the resulting etched lead frame. The leads of the lead frame have the configuration of FIG. 4A with the photoresist patterns 64a and 66a of FIG. 6A, and the leads of the lead frame have the configuration of FIG. 4B with the photoresist patterns 64b and 66b of FIG. 6B.

FIG. 7 shows a comparison of lead sweep results obtained with the invention against lead sweep obtained with leads produced with equal width top and bottom mask patterns. The x axis represents the amount of lead sweep in mils. The left y axis represents the above relationship between the a and b dimensions, which is a measure of the amount of misalignment between the top and bottom masks. The right y axis represents dimension m in FIG. 3b, which is a roughly corresponding measure of the amount of misalignment between the top and bottom equal width pattern masks used in the prior art. Each bar 70 on the graph represents measurements taken from a strip of 6 lead frames. The bar 72 represents measurements taken from 10 integrated circuit packages. The dotted lines 74 are an extrapolation of that data for smaller amounts of misalignment. The data was obtained from lead frames that had been formed. The lead sweep was measured and noted. The top to bottom mismatch was measured. Referring to FIG. 4A, "a" and "b" were measured on each of the leads that were measured for lead sweep. The absolute difference between "a" and "b" was divided by 2 to obtain the top to bottom mismatch. The maximum and minimum lead sweep observed was plotted in against the top to bottom mismatch value. Care was taken when either value of "a" or "b" was zero to assure that they were not a negative number, so that the angle of 40b to 42b is greater than 90°. The same procedure was used for the comparative measurement, except that the dimension m was used as the measure of misalignment. The graph shows the lead type 20a and 20b as "Standard" and lead type 36a and 36b as "Trapezoidal." These results show that lead sweep is both substantially reduced by the process of the invention and is made far less sensitive to the amount of misalignment between the top and bottom masks. For typical industry mask misalignment of from about 0.75 to about 1.5 mils, lead sweep is substantially eliminated It should now be readily apparent to those skilled in the art that a novel process capable of achieving the stated objects of the invention has been provided The process substantially reduces lead sweep in integrated circuit packages fabricated with J bends in the leads from double sided etched leads by providing a substantial tolerance for misalignment between the top and bottom masks.

It should further be apparent to those skilled in the art that various changes in form and details of the invention as shown and described may be made. It is intended that such changes be included within the spirit and scope of the claims appended hereto.

What is claimed is:

1. A process for the reduction of lead sweep in an integrated circuit package, which comprises providing a metal sheet from which leads of the package are to be formed, coating an upper and a lower surface of the metal sheet with photoresist layers, providing first and second masks having corresponding patterns defining the leads to be formed in the metal sheet but with different line widths for the upper and lower surfaces of the metal sheet, the first mask having a lesser line width than the second mask, exposing the photoresist layer on the upper surface of the metal sheet through the first mask, exposing the photoresist layer on the lower surface of the metal sheet through the second mask, developing the photoresist layers, etching the metal sheet to form the leads of the package, assembling the package on the leads, and bending the leads to place at least a portion of the lower surface forming the leads against the package.

2. The process of claim 1 in which the metal sheet has a thickness of between about 5 and 10 thousandths of an inch.

3. The process of claim 1 in which the leads are bent in a J configuration.

* * * * *